(12) United States Patent
Tan (10) Patent No.: US 8,866,273 B2
(45) Date of Patent: Oct. 21, 2014

(54) LEAD FRAME AND SEMICONDUCTOR PACKAGE STRUCTURE THEREOF

(71) Applicant: Silergy Semiconductor Technology (Hangzhou) Ltd, Hangzhou (CN)

(72) Inventor: Xiaochun Tan, Hangzhou (CN)

(73) Assignee: Silergy Semiconductor Technology (Hangzhou) Ltd, Hangzhou (CN)

( * ) Notice: Subject to any disclaimer, the term of this patent is extended or adjusted under 35 U.S.C. 154(b) by 128 days.

(21) Appl. No.: 13/674,201

(22) Filed: Nov. 12, 2012

(65) Prior Publication Data

US 2013/0134567 A1 May 30, 2013

(30) Foreign Application Priority Data

Nov. 29, 2011 (CN) .......................... 2011 1 0384742

(51) Int. Cl.
*H01L 23/495* (2006.01)
*H01L 23/48* (2006.01)

(52) U.S. Cl.
USPC .................... 257/666; 257/778; 257/E23.031

(58) Field of Classification Search
CPC ............... H01L 24/81; H01L 23/3107; H01L 23/49503; H01L 23/49545; H01L 23/49548
USPC ................. 257/666, 778, E23.031
See application file for complete search history.

(56) References Cited

U.S. PATENT DOCUMENTS

| 4,918,511 | A  | * | 4/1990  | Brown .......................... 257/669 |
| 5,477,086 | A  | * | 12/1995 | Rostoker et al. .............. 257/737 |
| 6,316,822 | B1 | * | 11/2001 | Venkateshwaran et al. .. 257/666 |
| 6,400,004 | B1 | * | 6/2002  | Fan et al. ...................... 257/666 |
| 6,498,392 | B2 | * | 12/2002 | Azuma ........................... 257/676 |
| 6,750,546 | B1 |   | 6/2004  | Villanueva |
| 7,081,666 | B2 | * | 7/2006  | Joshi et al. .................... 257/666 |
| 7,525,179 | B2 | * | 4/2009  | Joshi et al. .................... 257/666 |
| 8,723,324 | B2 | * | 5/2014  | Camacho et al. ............. 257/773 |
| 2006/0284291 | A1 | * | 12/2006 | Joshi et al. .................... 257/676 |

FOREIGN PATENT DOCUMENTS

CN            101694837 A           4/2010

* cited by examiner

*Primary Examiner* — Nitin Parekh
(74) *Attorney, Agent, or Firm* — Michael C. Stephens, Jr.

(57) ABSTRACT

The present invention relates to the field of semiconductor package structures, and more specifically to a lead frame and a semiconductor package structure thereof. In one embodiment, a lead frame can include a plurality of parallel-arrayed lead fingers with a plurality of grooves situated on surfaces of the lead fingers, where the depths of the grooves can be smaller than the thickness of the lead fingers. In one embodiment, a flip chip semiconductor package structure can include a chip, a group of bumps, and the above-described lead frame. The first surfaces of the bumps can be coupled to the front surface of the chip, and the second surfaces of the bumps can be coupled to the upper surface of the lead frame.

10 Claims, 7 Drawing Sheets

LEAD FRAME AND SEMICONDUCTOR PACKAGE STRUCTURE THEREOF

RELATED APPLICATIONS

This application claims the benefit of Chinese Patent Application No. 201110384742.5, filed on Nov. 29, 2011, which is incorporated herein by reference in its entirety.

FIELD OF THE INVENTION

The present invention relates to the field of semiconductor package structures, and more specifically to a lead frame and a semiconductor package structure thereof.

BACKGROUND

A lead frame can function as a chip carrier for an integrated circuit, and can also establish an electrical connection between the chip and outside circuitry. A lead frame can be in different structures corresponding to different package structures (e.g., flip chip package). Most of the conventional lead frames have a regular geometric shape to facilitate production. Conventionally, bond wires may be applied to connect the semiconductor chip to the lead frame. However, in flip chip semiconductor packaging, a plurality of solder bumps can be used to electrically connect the chip to the substrate or the lead frame. This flip chip semiconductor package structure may not only greatly decrease the package size because the size of the substrate can be close to the semiconductor chip size, but also can eliminate parasitic resistances on the bond wires to lower the impedances and improve signal transmission efficiency.

SUMMARY

In one embodiment, a lead frame can include a plurality of parallel-arrayed lead fingers with a plurality of grooves situated on surfaces of the lead fingers, where the depths of the grooves can be smaller than the thickness of the lead fingers.

In one embodiment, a flip chip semiconductor package structure can include a chip, a group of bumps, and the above-described lead frame. The first surfaces of the bumps can be coupled to the front surface of the chip, and the second surfaces of the bumps can be coupled to the upper surface of the lead frame.

Embodiments of the present invention can advantageously provide several advantages over conventional approaches. For example, a flip chip semiconductor package structure can distribute the mechanical stress caused by different coefficients of thermal expansion by utilising grooves on upper and/or lower surfaces of the lead fingers. Also, the possibility of delamination of the semiconductor chip can be decreased to improve package reliability. Other advantages of the present invention may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Embodiments of the present invention can advantageously provide several advantages over conventional approaches. For example, a flip chip semiconductor package structure can distribute the mechanical stress caused by different coefficients of thermal expansion by utilizing grooves on upper and/or lower surfaces of the lead fingers. Also, the possibility of delamination of the semiconductor chip can be decreased to improve package reliability. The invention, in its various aspects, may be explained in greater detail below with regard to exemplary embodiments.

Figure 1A:
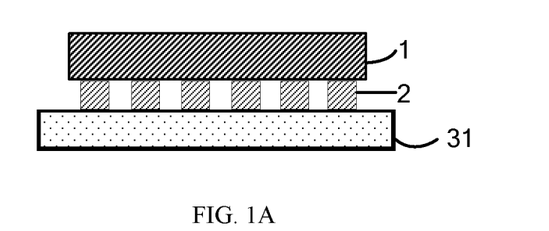
FIG. 1A is a diagram of an example flip chip semiconductor package structure.
Figure 1B:
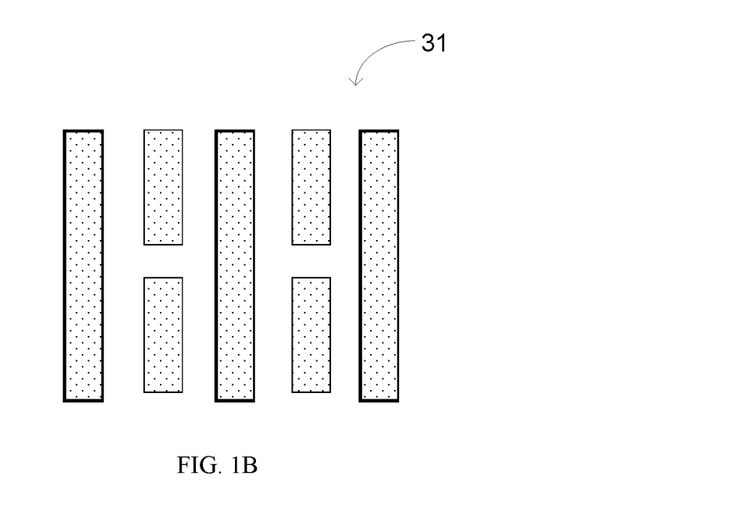
FIG. 1B is a cross sectional view of the flip chip semiconductor package structure shown in FIG. 1A.

Referring to FIG. 1A and FIG. 1B, an example flip chip semiconductor package structure and its cross sectional view are shown. In this example, semiconductor chip 1 can be coupled to substrate 31 (or a lead frame) through bumps 2. Also, adhesive materials can be filled in between semiconductor chip 1 and substrate 31, or between semiconductor chip 1 and the lead frame, to coat bumps 2 and improve the strength of bumps 2 to better support semiconductor chip 1.

Because the coefficient of thermal expansion (CTE) values for semiconductor 1, substrate 31 (or the lead frame), and bumps 2 are likely different, during a thermal cycling process of chip packaging, the thermal stress and thermal deformation quantity may be proportional to a distance to the chip center, as shown in equation (1) below.

$$\delta = \alpha \times L \times \Delta t \qquad (1)$$

Here, $\delta$ can denote the hot deformation quantity, $\alpha$ can denote the coefficient of thermal expansion of material, $\Delta t$ can denote the temperature variation, and $L$ can denote the distance to the chip center.

From equation (1), it can be seen that an edge of semiconductor chip 1 may suffer the greatest thermal stress and thermal deformation quantity, since the distance from an edge to the chip center may be farthest, the semiconductor chip may thereby be delaminated, resulting in failure during packaging.

In addition, during the operation process of the semiconductor chip, temperature variations, and different coefficients of thermal expansion of the semiconductor chip and the substrate or lead frame may cause a mechanical stress between them. For example, when the semiconductor chip and the substrate or lead frame are both in high temperature, the thermal expansion on them may be different to cause mechanical stresses therebetween.

Therefore, avoiding such a delamination problem and minimizing mechanical stress between the semiconductor chip and the substrate or lead frame may become increasingly important. In one embodiment, a lead frame can include a plurality of parallel-arrayed lead fingers with a plurality of grooves situated on surfaces of the lead fingers, where the depths of the grooves can be smaller than the thickness of the lead fingers.

Figure 2A:
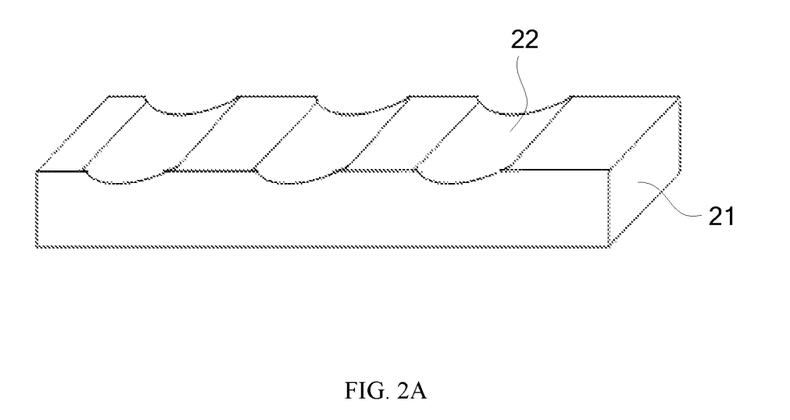
FIG. 2A is a structure diagram of an example lead finger of a lead frame in accordance with embodiments of the present invention.

Referring now to FIG. 2A, shown is a structure diagram of an example lead finger of a lead frame in accordance with embodiments of the present invention. In this example, a group of semi-circle grooves 22 can be situated in parallel on an upper surface of lead finger 21. Also, depths of grooves 22 can be smaller than a thickness of lead finger 21, and grooves 22 can be disposed along a length direction of lead finger 21.

Figure 2B:
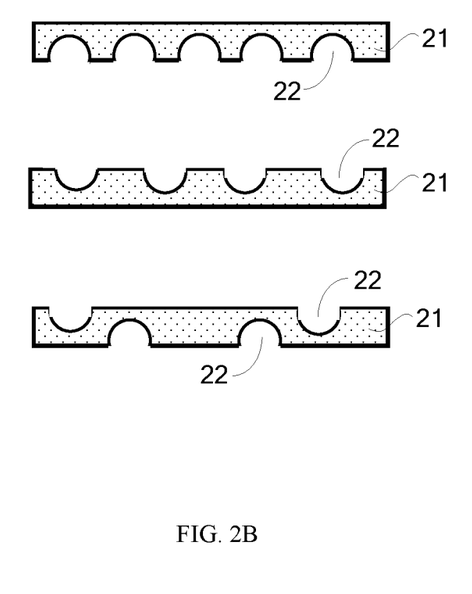
FIG. 2B shows cross sectional views of three different example lead fingers of a lead frame in accordance with embodiments of the present invention.

Referring to FIG. 2B, shown are cross sectional views of three different example lead fingers of a lead frame in accordance with embodiments of the present invention. As seen in FIG. 2B, grooves 22 may not only be situated on an upper surface of lead finger 21, but also can be situated on a lower surface of lead finger 21, or on both of upper and lower surfaces of lead finger 21. Also, people skilled in the art will recognize that the shape of grooves 22 may not be limited to semi-circle shapes, but can also in other shapes (e.g., arc, triangle, rectangle, etc.). Grooves 22 can also be situated in other arrangements. Further, a length of grooves 22 can be substantially the same as a width of lead finger 21, or smaller than the width of lead finger 21.

In one embodiment, a flip chip semiconductor package structure can include a chip, a group of bumps, and the above-described lead frame. The first surfaces of the bumps can be coupled to the front surface of the chip, and the second surfaces of the bumps can be coupled to the upper surface of the lead frame.

Figure 3A:
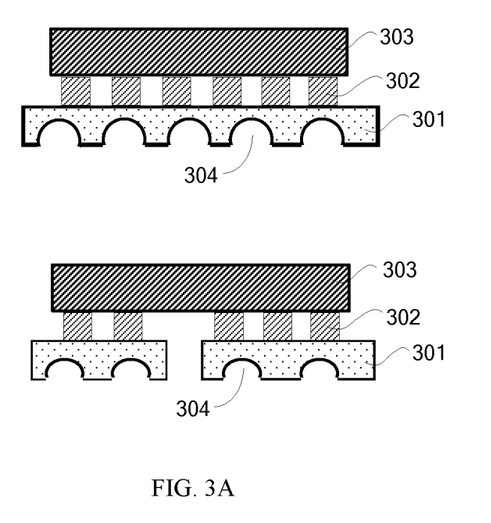
FIG. 3A shows cross sectional views of a first two example flip chip semiconductor package structures in accordance with embodiments of the present invention.

Referring to FIG. 3A, shown are cross sectional views of a first two example flip chip semiconductor package structures in accordance with embodiments of the present invention. Both of the two flip chip semiconductor package structures can include chip 303, a plurality of bumps 302, and a lead frame formed by a group of lead fingers 301. In the top example shown in FIG. 3A, each of lead fingers 301 may be formed by one metal component, and a group of grooves 304 can be situated in parallel on lower surfaces of lead fingers 301. The depths of grooves 304 can be smaller than a thickness of lead fingers 301. Also, lower surfaces of bumps 302 can be coupled to upper surfaces of lead fingers 301, and the upper surfaces of bumps 302 can be coupled to a front surface of chip 303. In addition, adhesive materials can be filled into an area between chip 303 and the lead frame (e.g., formed via lead fingers 301). Different from the top example above, in the bottom example of FIG. 3A, each of lead fingers 301 can be formed by two separate metal components.

By applying the flip chip semiconductor package structures shown in FIG. 3A, mechanical stress caused by different coefficients of thermal expansion can be spread out, and may thereby decrease the possibility of delamination, and increase the reliability of the semiconductor package structure, in accordance with equation (1) shown above.

Figure 3B:
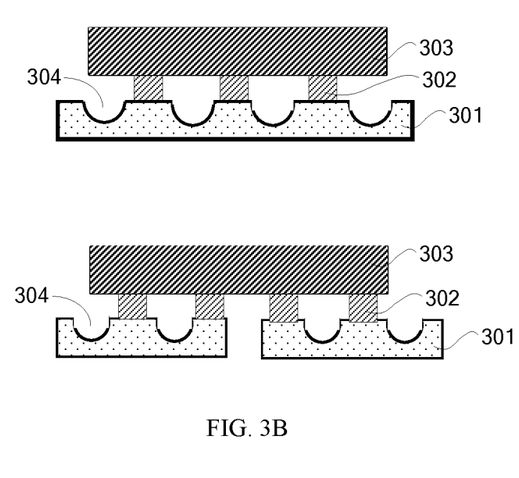
FIG. 3B shows cross sectional views of a second two example flip chip semiconductor package structures in accordance with embodiments of the present invention.

Referring to FIG. 3B, shown are cross sectional views of a second two example flip chip semiconductor package structures in accordance with embodiments of the present invention. Both of the two flip chip semiconductor package structures can include chip 303, a group of bumps 302, and a lead frame formed by a group of lead fingers 301.

In the top example shown in FIG. 3B, each of lead fingers 301 can be formed by one common metal component, and a group of grooves 304 can be situated in parallel on the upper surfaces of lead fingers 301. The depths of grooves 304 can be smaller than a thickness of lead fingers 301. Lower surfaces of bumps 302 can be coupled to remaining parts of the upper surface besides grooves 304 of lead fingers 301. Also, upper surfaces of bumps 302 can be coupled to a front surface of chip 303. Also, adhesive materials can be filled into the area between chip 303 and the lead frame (e.g., formed via lead fingers 301). Different from the top example, in the bottom example of FIG. 3B, each of lead fingers 301 can be formed by two separate metal components. Also, by applying the flip chip semiconductor package structures shown in FIG. 3B, the same or substantially the same technical results can be achieved as FIG. 3A.

Figure 3C:
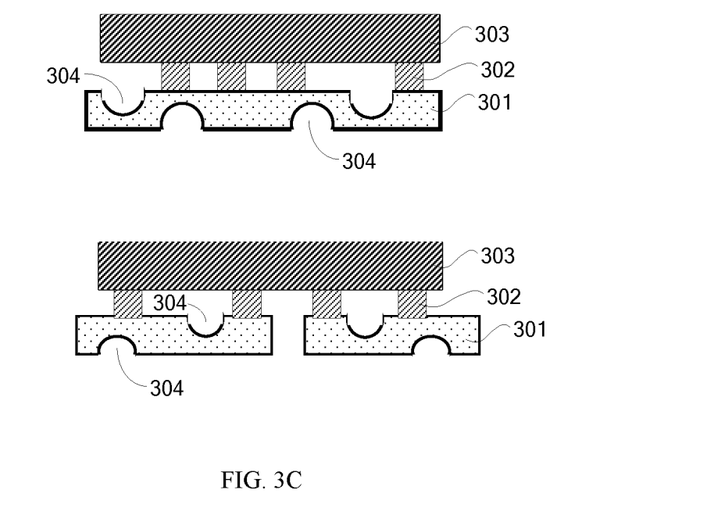
FIG. 3C shows cross sectional views of a third two example flip chip package structures in accordance with embodiments of the present invention.

Referring to FIG. 3C, shown are cross sectional views of a third two example flip chip package structures in accordance with embodiments of the present invention. Both of the two flip chip semiconductor package structures can include chip 303, a group of bumps 302, and a lead frame formed by a group of lead fingers 301.

In the top example shown in FIG. 3C, each of lead fingers 301 can be formed by one metal component, and a group of grooves 304 can be situated in parallel as shown on upper and lower surfaces of lead fingers 301. The depths of grooves 304 can be smaller than a thickness of lead fingers 301. The lower surfaces of bumps 302 can be coupled to the remaining parts of the upper surface besides grooves 304 of lead fingers 301, and the upper surfaces of bumps 302 can be coupled to the front surface of chip 303. Also, adhesive materials can be filled into the area between chip 303 and the lead frame (e.g., formed via lead fingers 301). Different from the top example, in the bottom example of FIG. 3C, each of lead fingers 301 can be formed by two separate metal components. Also, by applying the flip chip semiconductor package structures shown in FIG. 3C, the same or substantially similar technical results can be achieved as discussed above.

It should be mentioned that the adhesive materials may not be shown in FIGS. 3A, 3B and 3C, however may be added as described above. It also should be mentioned that in the above-described example flip chip semiconductor package structures, each of the lead fingers can also be formed by one, two, or more than two (e.g., three, four, etc.) metal components.

According to the teaching of the embodiments of the present invention, people skilled in the art will recognize that the shape of grooves can be in, e.g., arc, semi-circle, rectangle, triangle, or any other appropriate shapes. The examples of the embodiments of present invention can also be applied to a semiconductor package structure with a relatively large substrate. The mechanical stress can also be spread out by setting a group of grooves on the substrate, as described above with reference to lead fingers.

Thus, in the example flip chip semiconductor package structures in accordance with embodiments of the present invention, the shape of lead frames or substrates may no longer be confined to a regular geometric shape (e.g., a rectangle). In particular embodiments, a group of grooves can be positioned on the surfaces of the lead fingers of the lead frames or substrates to distribute the mechanical stress caused by different coefficients of thermal expansion. By improving the structures of the lead frames or substrates, the mechanical stress can be decreased, and the reliability of chip package structure can be increased as compared to conventional approaches.

The embodiments were chosen and described in order to best explain the principles of the invention and its practical application, to thereby enable others skilled in the art to best utilise the invention and various embodiments with various modifications as are suited to the particular use contemplated. It is intended that the scope of the invention be defined by the claims appended hereto and their equivalents.

What is claimed is:

1. A lead frame, comprising:
   a) a plurality of lead fingers configured to extend under a chip, wherein said plurality of lead fingers are arrayed in parallel; and
   b) a plurality of grooves situated on surfaces of said plurality of lead fingers, wherein each of said plurality of grooves has a depth less than a thickness of a corresponding of said plurality of lead fingers, and
   c) wherein each of said plurality of grooves has a length that is the same as a width of a corresponding of said plurality of lead fingers to form an opening at either side edge of said corresponding lead finger.

2. The lead frame of claim 1, wherein each of said plurality of grooves is situated on an upper surface of a corresponding of said plurality of lead fingers.

3. The lead frame of claim 1, wherein each of said plurality of grooves is situated on a lower surface of a corresponding of said plurality of lead fingers.

4. The lead frame of claim 1, wherein each pair of said plurality of grooves is situated on upper and lower surfaces of a corresponding of said plurality of lead fingers.

5. The lead frame of claim 1, wherein each of said plurality of grooves comprises a cross-sectional shape of arc, semi-circle, rectangle, or triangle.

6. The lead frame of claim 1, wherein said opening comprises a semi-circle opening.

7. The lead frame of claim 1, wherein said plurality of grooves is disposed in parallel along a length direction of said plurality of lead fingers.

8. A flip chip semiconductor package structure, comprising:
   a) said chip;
   b) a plurality of bumps, wherein each of said plurality of bumps comprises first and second bump surfaces; and
   c) said lead frame of claim 1, wherein said first bump surfaces are coupled to a front surface of said chip, and wherein said second bump surfaces are coupled to an upper surface of said lead frame.

9. The flip chip semiconductor package structure of claim 8, wherein said plurality of bumps are situated on portions of said upper surface of said lead frame that are different than portions of said plurality of grooves.

10. The flip chip semiconductor package structure of claim 8, further comprising adhesive materials applied to fill an area between said chip and said lead frame.

* * * * *